US012765371B2

(12) United States Patent
Escoffier

(10) Patent No.: US 12,765,371 B2
(45) Date of Patent: Oct. 13, 2026

(54) POWER MICROELECTRONIC DEVICE

(71) Applicant: COMMISSARIAT A L'ENERGIE ATOMIQUE ET AUX ENERGIES ALTERNATIVES, Paris (FR)

(72) Inventor: Rene Escoffier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 19/256,431

(22) Filed: Jul. 1, 2025

(65) Prior Publication Data

US 2026/0011617 A1 Jan. 8, 2026

(30) Foreign Application Priority Data

Jul. 3, 2024 (FR) ...................................... 2407274

(51) Int. Cl.

| | |
|---|---|
| ***H10D 30/47*** | (2025.01) |
| ***H10D 8/60*** | (2025.01) |
| ***H10D 62/85*** | (2025.01) |
| ***H10D 62/852*** | (2025.01) |
| ***H10D 84/00*** | (2025.01) |
| ***H10D 89/10*** | (2025.01) |
| ***H10W 20/40*** | (2026.01) |
| ***H10W 40/00*** | (2026.01) |

(52) U.S. Cl.

CPC .............. *H10W 40/00* (2026.01); *H10D 8/60* (2025.01); *H10D 30/4732* (2025.01); *H10D 30/475* (2025.01); *H10D 30/4755* (2025.01); *H10D 84/101* (2025.01); *H10D 89/105* (2025.01); *H10W 20/484* (2026.01); *H10D 62/8503* (2025.01); *H10D 62/852* (2025.01)

(58) Field of Classification Search

CPC .. H10D 30/47; H10D 30/4732; H10D 89/105; H10D 64/0124; H10D 64/311

See application file for complete search history.

(56) References Cited

U.S. PATENT DOCUMENTS

| | | | | |
|---|---|---|---|---|
| 2011/0204807 | A1* | 8/2011 | Hashizume .......... | H10D 64/411 315/246 |
| 2015/0270254 | A1 | 9/2015 | Risbud | |
| 2019/0028065 | A1* | 1/2019 | Mahon et al. | |

(Continued)

OTHER PUBLICATIONS

Chasin et al. "UHF IGZO Schollky Diode." Conference Paper in Electron Devices Meeting, 1988. IEDM '88. Technical Digest., International • Dec. 2012. DOI: 10.1109/IEDM.2012.6479030.

(Continued)

*Primary Examiner* — Matthew C Landau

(74) *Attorney, Agent, or Firm* — Oblon, McClelland, Maier & Neustadt, L.L.P.

(57) ABSTRACT

A power device includes high electron mobility transistors formed on an active layer, each transistor comprising a source finger, a drain finger and a gate finger, a source contact common to the source fingers, a drain contact common to the drain fingers, and a gate contact common to the gate fingers. At least one gate finger is not connected to the gate contact and forms a Schottky contact with the active layer. This gate finger forms, with the neighbouring drain finger, a Schottky diode configured to measure an operating temperature within the power device.

10 Claims, 5 Drawing Sheets

(56) References Cited

U.S. PATENT DOCUMENTS

| | | | |
|---|---|---|---|
| 2020/0144970 | A1 | 5/2020 | Mahon et al. |
| 2023/0068822 | A1 * | 3/2023 | Kim et al. |

OTHER PUBLICATIONS

Stefano Lovati. "Investigation of Body diode Reliability for 1200 V SiC MOSFET," (https:www.powerelectronicnews.com/author/stefano-lovati). Nov. 30, 2022.
Onsemi. "Current Sensing Power MOSFETs." Semiconductor Components Industries, LLC. 2002. Mar. 2017—Rev. 6. Publication Order No. AND8093/D.
Pangallo et al. "Use of Body-Diode for Thermal Monitoring of Power MOSFET." SENSORDEVICES 2018 : The Ninth International Conference on Sensor Device Technologies and Applications.
Reiner et al. "Linear temperature sensors in high-voltage GaN-HEMT power devices." 2016 JEBE Applied Power Electronics Conference and Exposition (APEC). Mar. 20-24, 2016, Long Beach, CA, USA. DOI: 10.1109/APEC.2016.7468154.

* cited by examiner

POWER MICROELECTRONIC DEVICE

CROSS REFERENCE TO RELATED APPLICATIONS

This application claims the priority benefit of French patent application number 2407274, filed on Jul. 3, 2024, entitled “Power Microelectronic Device”, which is hereby incorporated by reference to the maximum extent allowable by law.

TECHNICAL FIELD

The present invention relates to the field of microelectronic. It has a particularly advantageous application in measuring temperature for power components, typically for GaN-based HEMT-type transistors (high electron mobility transistors).

PRIOR ART

Power components are designed to operate with high current densities and/or with high operating voltages. The operation of these components generates a significant heating, with an operating temperature which can reach 150° C. A challenge linked to the design of these power components relates to the thermal dissipation effectiveness. Another challenge relates to controlling the operating temperature of these components.

To respond to these challenges, it is necessary to know the temperature of these component in operation. Several methods have been developed to measure or estimate the temperature of these components. A direct measuring method consists of placing a temperature sensor, for example, a metal coil, in the proximity of the component to be characterised. By injecting a constant current into the coil and by measuring the voltage at its terminals, a direct measurement of the temperature is obtained. For HEMT transistors, the metal coil can be replaced by a conductive bar placed above the two-dimensional electron gas (2DEG) circulating in the HEMTs. The document, “Linear Temperature Sensors in High-Voltage GaN-HEMT Power Devices, R. Reiner et al., 2016 IEEE Applied Power Electronics Conference and Exposition (APEC)” discloses such a temperature sensor integrated within a HEMT transistor architecture. This solution however increases the size of the HEMT transistor-based device. The conductive bars of the temperature sensor are further disposed between two HEMT transistors. The temperature is therefore measured at the side of the transistors. This sensor does not accurately measure the actual operating temperature within the transistor.

For other types of components, in particular, for MOS (metal oxide semiconductor) transistors, it is possible to benefit from the structure of these MOS transistors to measure a diode feature structurally present within the MOS transistors. This diode called “diode body” is typically formed by a PN junction between the boxes of the transistor. A voltage measurement at the terminals of this diode body makes it possible to indirectly access the operating temperature of the transistor. The temperature is, in this case, measured within the transistor. This method which utilises a particular structure of the component is not applicable to all the components. HEMT transistors, in particular, cannot be characterised via this method.

An aim of the present invention is to propose a temperature sensor architecture for a power component overcoming the disadvantages mentioned above.

In particular, an aim of the present invention is to propose a power microelectronic device comprising HEMT transistors and a temperature sensor having a reduced size.

Another aim of the present invention is to propose a power microelectronic device comprising HEMT transistors and a temperature sensor having an improved measuring accuracy.

Other aims, features and advantages of the present invention will appear upon examining the description below and the accompanying drawings. It is understood that other advantages can be incorporated.

SUMMARY

To achieve this aim, according to an embodiment, a power microelectronic device is provided, comprising:

- A plurality of high electron mobility basic transistors, formed on an active layer and connected in parallel, each basic transistor comprising a source finger, a drain finger and a gate finger interposed between the source finger and the drain finger,
- A source contact common to the source fingers,
- A drain contact common to the drain fingers,
- A gate contact common to the gate fingers.

Advantageously, at least one gate finger is not connected to the gate contact and forms a Schottky contact with the active layer. Advantageously, said at least one gate finger forms, with the neighbouring drain finger, at least one Schottky-type diode configured to measure an operating temperature within the power microelectronic device.

The microelectronic device thus has a temperature sensor integrated in the plurality of basic transistors, in Schottky diode form. This sensor utilises at least one gate fingers and one drain finger of a basic transistor, which are current elements of the power microelectronic device. The integration of the sensor in the power microelectronic device is total. The size of the sensor in the power microelectronic device is very limited, even negligible.

Moreover, by utilising the current design of a basic transistor, the Schottky diode has breakdown voltage features equal to that of the basic transistor, from which it is formed. The temperature measured by the Schottky diode is very close, even equal to the actual operating temperature of a basic transistor of the power microelectronic device. The measuring accuracy of the sensor with regard to the actual operating temperature of the basic transistors is improved.

A principle of the invention is to locally measure an operating temperature by a Schottky diode by replacing a current gate finger of a power microelectronic device by a Schottky contact. According to an option, several gate fingers can be replaced by Schottky contacts, so as to form several Schottky diodes within the power microelectronic device. It is thus possible to access several localised temperature measurements. An operating temperature mapping of the power microelectronic device can advantageously be taken by the sensor according to the invention. This makes it possible to detect possible hot points during the operation of the power microelectronic device. This makes it possible to prevent or avoid failures of the power microelectronic device.

BRIEF DESCRIPTION OF THE FIGURES

The aims, objectives, as well as the features and advantages of the invention will best emerge from the detailed description of embodiments of the latter, which are illustrated by the following accompanying drawings, in which.

Figure 1A:
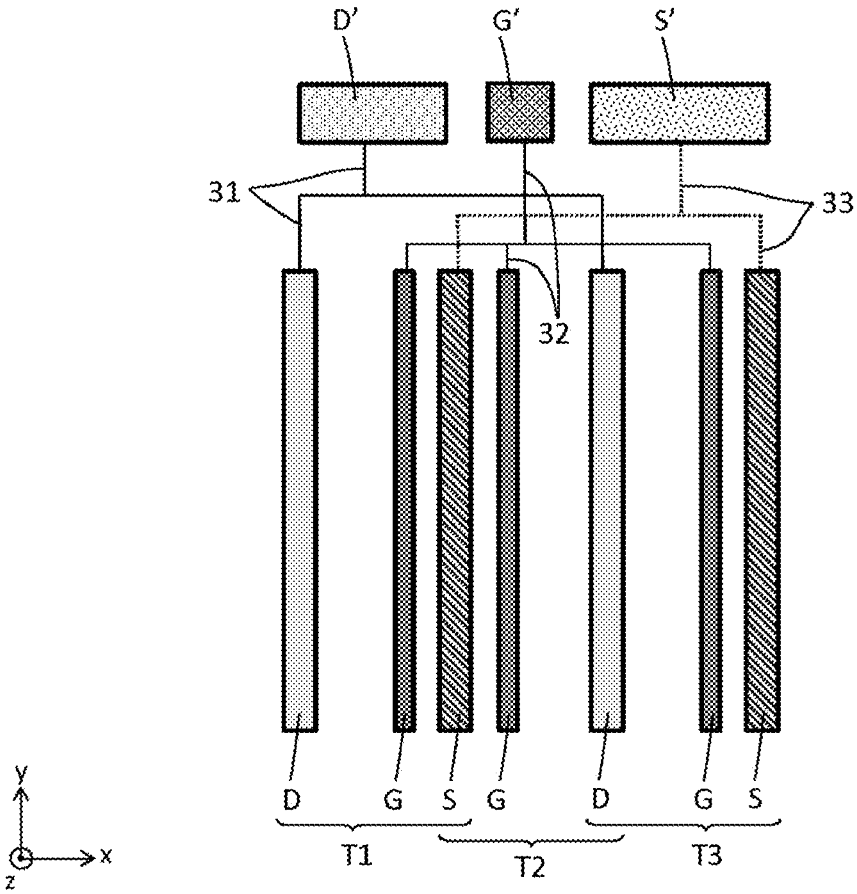
Fig. 1A PRIOR ART
FIGS. 1A, 1B schematically illustrate, respectively as a top view and as a cross-sectional view, a power microelectronic device comprising HEMT transistors, according to the prior art.

The drawings are given as examples and are not limiting of the invention. They constitute principle schematic representations, intended to facilitate the understanding of the invention and are not necessarily to the scale of practical applications. In particular, on the principle diagrams, the thicknesses of the different layers, and the dimensions of the different elements (fingers, contacts, etc.) are not representative of reality.

DETAILED DESCRIPTION

Before starting a detailed review of embodiments of the invention, optional features are stated below, which can optionally be used in association or alternatively:

According to an example, the at least one gate finger forming the Schottky contact is connected to the neighbouring source finger. This makes it possible to only preserve one Schottky diode between said gate finger and the neighbouring drain finger. This makes it possible to avoid forming another diode between said gate finger and the neighbouring source finger.

According to an example, this neighbouring source finger is connected to the source contact of the power microelectronic device, such that measuring the operating temperature is done through said source contact. The measurement is done typically in the blocking situation of the basic transistors, in the fourth quadrant of the feature of these basic transistors.

According to another example, the power microelectronic device comprises at least one detection contact, independent of the source, drain and gate contacts, and the neighbouring source finger, i.e. the source finger connected to the at least one gate finger forming the Schottky contact, is connected to said at least one detection contact, such that measuring the operating temperature is done through said at least one detection contact. The measurement is done independently of the operation of the basic transistors.

According to an example, the device further comprises a barrier layer, for example, AlGaN-based, inserted between the active layer and the gate fingers. According to an example, the at least one gate finger forming the Schottky contact passes through at least partially said barrier layer. According to an alternative example, the at least one gate finger forming the Schottky contact is disposed on said barrier layer. The Schottky contact can be produced by etching the AlGaN-based barrier layer, then etching a few nanometres of the GaN-based active layer, and by deposition of a metal, for example, at least 60 nanometres of TiN or a few hundreds of nanometres of nickel. This makes it possible to contact the 2DEG laterally. The metals are chosen according to their output work in order to adjust the Schottky barrier as needed.

According to an example, the at least one gate finger forming the Schottky contact comprises a plurality of gate fingers, forming with the respective neighbouring drain fingers, a plurality of Schottky-type diodes configured to each measure an operating temperature within the power microelectronic device. This makes it possible to raise temperatures in different zones of the device. If the anodes of the Schottky diodes are all connected to the source contact, an average temperature measurement is obtained. If the anodes of the Schottky diodes are connected to independent contacts, local temperature measurements are obtained.

According to an example, the power microelectronic device comprises a plurality of independent detection contacts, and the gate fingers of the plurality of Schottky diodes are connected to said independent detection contacts, such that the operation temperatures are measured through said detection contacts. This makes it possible to take local temperature measurements, for example, on several zones of the device.

According to an example, one single detection contact of the plurality of independent detection contacts corresponds to one single gate finger of the plurality of Schottky diodes. This makes it possible to take local and specific temperature measurements. A temperature mapping within the device can be advantageously performed.

According to an example, the basic transistors are arranged in matrix form. According to an example, the Schottky-type diodes are distributed randomly within said matrix. According to another example, the Schottky-type diodes are distributed according to a symmetrical distribution within said matrix. The Schottky diodes can be distributed according to the hot points of the device, for example, to avoid a failure of the device or to monitor a thermal dissipation within the device.

According to an example, the basic transistors are arranged in rectangular matrix form, and the device comprises at least four Schottky-type diodes, disposed at the four corners of said rectangular matrix. The temperature measured at the corners of the device can be partially due to adjacent devices.

Unless incompatible, it is understood that all of the optional features above and/or the variants indicated can be combined, so as to form an embodiment which is not necessarily illustrated or described. Such an embodiment is clearly not excluded from the invention.

In the scope of the present invention, the power device architectures considered are based on a two-dimensional electron gas (2DEG) conduction principle.

HEMT (high electron mobility transistor)-type transistors, are in particular based on this two-dimensional electron gas architecture. For power and temperature handling reasons (in particular, high-voltage power and temperature handling), the semiconductor material of these transistors is preferably chosen, so as to have a wide bandgap. Among wide bandgap HEMT transistors, gallium nitride-based transistors are generally preferred.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

For example, and in a manner known per se, in the field of GaN-based HEMT-type transistors, a thin AlN layer can be inserted between two GaN and AlGaN semiconductor layers.

A layer can moreover be composed of several sublayers of one same material or of different materials.

By a substrate, a stack, a layer, "with the basis" of a material A, this means a substrate, a stack, a layer comprising this material A only, or this material A and optionally other materials, for example, alloy elements and/or doping elements.

The doping ranges associated with the different doping types possibly indicated in the present application are as follows:

p++ or n++ doping: greater than $1\times10^{20}$ $cm^{-3}$ p+ or n+ doping: $1\times10^{18}$ $cm^{-3}$ to $9\times10^{19}$ $cm^{-3}$ p or n doping: $1\times10^{17}$ $cm^{-3}$ à $1\times10^{18}$ $cm^{-3}$ intrinsic or unintentionally doped doping: $1.10^{15}$ $cm^{-3}$ to $1.10^{17}$ $cm^{-3}$ A preferably orthonormal system, comprising the axes x, y, z is represented in the accompanying figures.

In the present patent application, the height of an element, typically a gate or drain finger, is taken along z. The thickness of a layer is taken along a direction normal to the main extension plane of this layer. Thus, a layer can typically have a thickness along z. The relative terms "on", "surmounts", "under", "underlying", "upper", "lower" refer to positions taken along the direction z.

The terms "vertical", "vertically" refer to a direction along z. The terms "lateral", "laterally" refer to a direction in the plane xy.

An element located "in vertical alignment with" or "to the right of" another element, means that these two elements are both located on one same line perpendicular to a plane in which a lower or upper face of a substrate mainly extends, i.e. on one same line oriented vertically in the figures.

The terms "substantially", "around", "about" mean "plus or minus 10%", or, when this is an angular orientation, "plus or minus 10%" and preferably "plus or minus 5%". Thus, a direction substantially normal to a plane means a direction having an angle of 90±10° with respect to the plane.

Figure 1B:
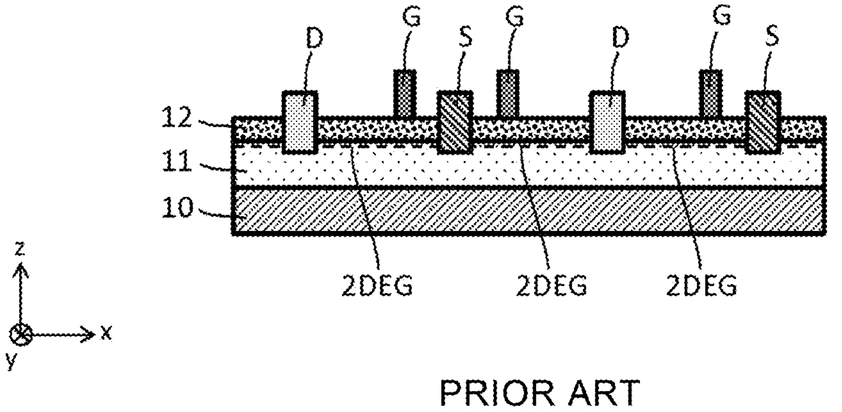
Fig. 1B PRIOR ART

FIGS. 1A, 1B respectively illustrate, as a top view, and as a cross-sectional view, a power device comprising several basic HEMT transistors T1, T2, T3. This arrangement is known. It alternates along the direction x, conventionally, a drain finger D, a gate finger G, a source finger S, a gate finger G, a drain finger D, a gate finger G, a source finger S.

The drain fingers D are connected through a connector 31 at a drain contact D'. The connector 31 conventionally comprises vias and metal tracks.

The gate fingers G are connected through a connector 32 to a gate contact G'. The connector 32 also conventionally comprises vias and metal tracks.

The source fingers S are connected through a connector 33 to a source contact S'. The connector 33 also conventionally comprises vias and metal tracks.

Basic HEMT transistors T1, T2, T3 are typically formed on a substrate comprising a support layer 10, for example, silicon-based, and a GaN-based active layer 11. This active layer 11 can comprise, in a known manner, different GaN- and/or AlGaN-based sublayers, for example, buffer and/or germination layers. A barrier layer 12, typically AlGaN-based, makes it possible to form, in the active layer 11, a two-dimensional electron gas 2DEG. This 2DEG gas enables the circulation of a current between the drain finger D and the source finger S of a basic transistor. The circulation of the current is controlled by a voltage Vgs applied between the gate finger G and the source finger S. When this voltage is greater than the threshold voltage Vth of the transistor, the transistor is on. The voltage feature in the on-state (called first quadrant) of the HEMT transistor typically has a linear regime and a saturation regime. When the voltage Vgs is less than the threshold voltage Vth of the transistor, the transistor is off. The voltage feature in the off-state (called third quadrant) of the HEMT transistor does not only depend on the temperature. This feature is also impacted by the gate bias Vgs). It is therefore not possible to accurately determine the temperature of the HEMT transistor from the third quadrant feature.

To overcome this disadvantage, a structural modification of the device is performed.

Figure 2A:
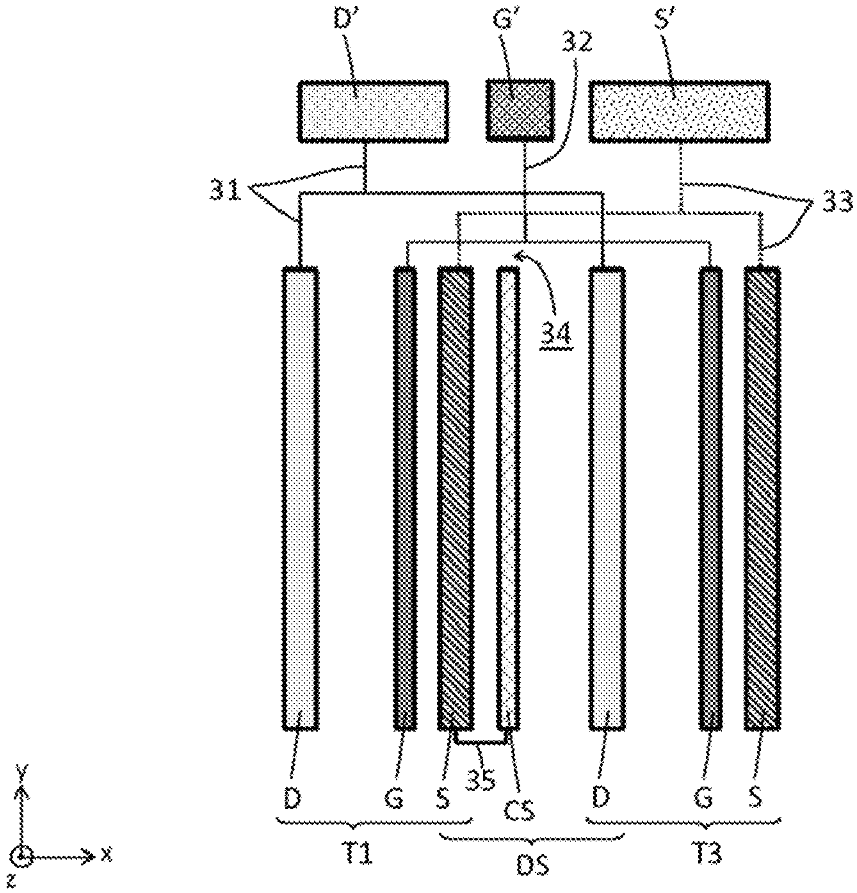
FIGS. 2A, 2B schematically illustrate, respectively as a top view and as a cross-sectional view, a power microelectronic device comprising HEMT transistors and a temperature sensor, according to an embodiment of the present invention.
Figure 2B:
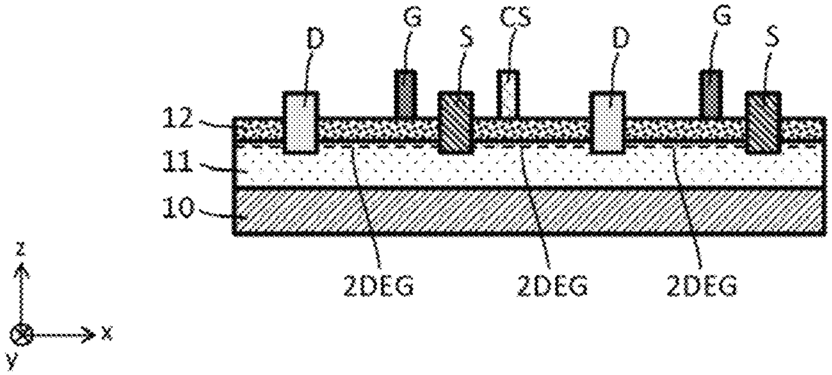

As illustrated in FIGS. 2A, 2B, a gate finger of a basic HEMT transistor is modified so as to obtain a Schottky contact CS forming, with the neighbouring drain finger D, a Schottky diode DS. This modification consists, in particular, of disconnecting 34 the gate finger from the gate contact G'. The Schottky diode DS is thus formed. The disconnected gate finger CS corresponds to the anode of the Schottky diode DS. The drain finger D corresponds to the cathode of the Schottky diode DS. This Schottky diode DS advantageously forms a temperature sensor for the device. The direct feature of the Schottky diode DS indeed depends on the temperature. The temperature impacts the gradient of the feature of the diode, as well as its value Vf (Schottky threshold voltage). To measure the temperature, a constant current is first injected from the anode to the cathode (direct direction) in this Schottky diode DS. The potential difference is then measured at the terminals of the Schottky diode DS. By using a calibration table, for example, from curves presented in the document, "UHF IGZO Schottky diode, A. Chasin et al., International Electronic Device Meeting-IEDM 2012", the temperature at the diode DS can be determined from the measured potential difference. For example, for an injected current of 0.1 A/mm and a measured voltage drop of 0.25V, a temperature of 378K, that is 105° C., is determined.

A determination of the local temperature of the device is therefore possible from the direct feature I(V), in the third quadrant, of the Schottky diode DS. The temperature sensor formed by the Schottky diode DS is advantageously totally integrated in the power microelectronic device.

Preferably, the disconnected gate finger CS and the source finger S are connected by a connector 35. This makes it possible to avoid forming a second diode in the opposite direction between the disconnected gate finger CS and the source finger S.

As illustrated in FIGS. 2A, 2B, the disconnected gate finger CS can be structurally identical to the other gate fingers G. This minimises the structural modifications of the device. The cost of manufacturing the temperature sensor within the power microelectronic device is reduced. According to another non-illustrated option, the disconnected gate finger CS can extend along z at least partially within the barrier layer 12. This makes it possible to adjust the threshold voltage and the feature of the Schottky diode DS.

Figure 3:
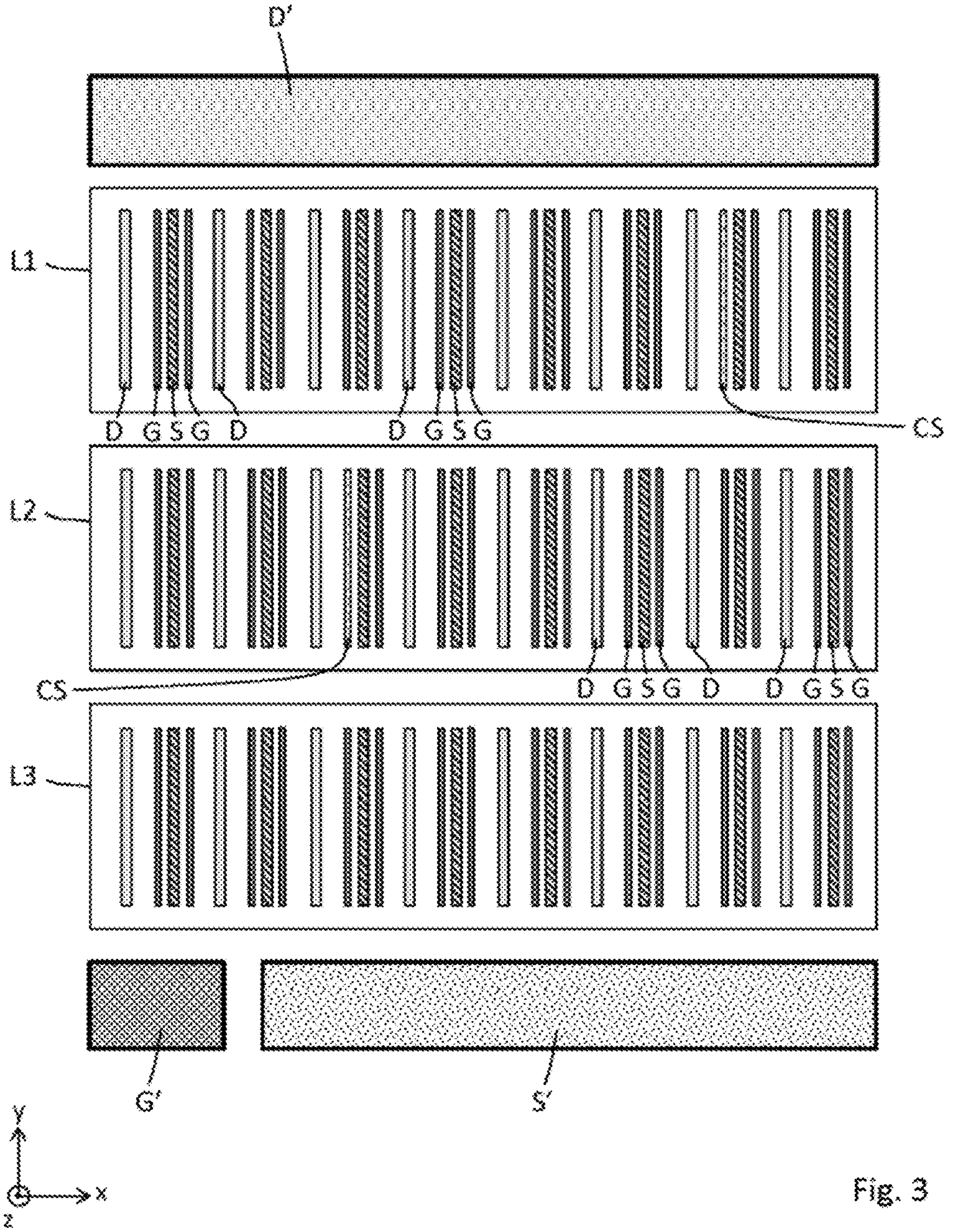
FIG. 3 schematically illustrates, as a top view, a HEMT transistor matrix of a power microelectronic device, within which temperature sensors are distributed according to an embodiment of the present invention.

As illustrated in FIG. 3, the power microelectronic device typically comprises several tens of basic HEMT transistors arranged in a matrix L1, L2, L3. The drain contact D' is common to all the drain fingers D. The source contact S' is common to all the source fingers S. The gate contact G' is common to all the gate fingers G. It is advantageously possible to locally modify a few gate fingers, so as to form Schottky contacts CS. Thus, several temperature sensors are obtained distributed within the basic HEMT transistor matrix L1, L2, L3.

In FIG. 3, two Schottky contacts CS fully integrated in the device are illustrated. Different Schottky contact CS distributions within the matrix L1, L2, L3 can be considered. According to an option, four Schottky contacts CS can be formed at the four corners of the matrix L1, L2, L3. According to another option, Schottky contacts CS can be placed at the hot points of the device. This makes it possible to monitor the temperature of the operating device and to avoid a possible failure of the device.

Figure 4A:
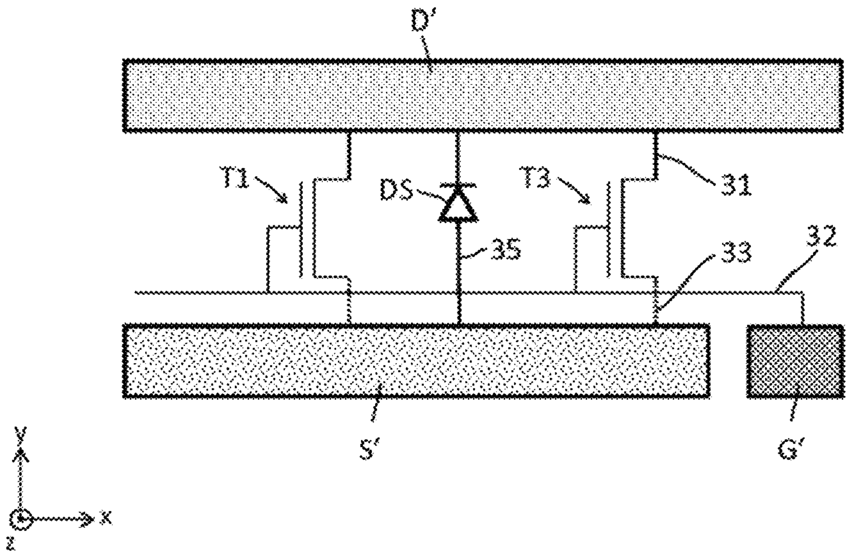
FIG. 4A schematically illustrates a temperature sensor in Schottky diode form integrated with the HEMT transistors of a power microelectronic device, according to an embodiment of the present invention.
Figure 4B:
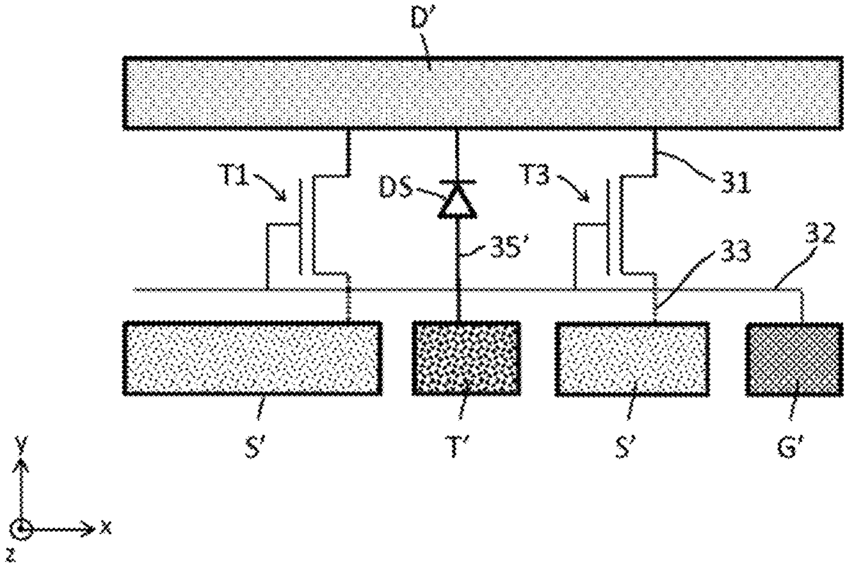
FIG. 4B schematically illustrates a temperature sensor in Schottky diode form integrated with the HEMT transistors of a power microelectronic device, according to another embodiment of the present invention.

When the placement of the sensors within the matrix L1, L2, L3 is chosen, different measuring configurations can be considered. FIGS. 4A, 4B illustrate some of these configurations.

According to an option illustrated in FIG. 4A, the anodes of the diodes DS are connected to the source contact S', for example, via the connector 35 with the neighbouring source finger of the Schottky contact CS. In this case, the measurement of the temperature is an average measurement over all of the sensors of the device. The measurement is, in this case, taken in the blocking situation of the basic HEMT transistors, in the third quadrant of the feature of the device.

According to an option illustrated in FIG. 4B, the anodes of the diodes DS are connected to one or more detection contacts T'. The detection contacts T' are independent of the source contacts S'. The detection contacts T' can correspond to pads disposed between the contact pads S', G', D'. The detection contacts T' can be connected via the neighbouring source finger of the Schottky contact CS, for example, through a specific connector 35' (vias and metal tracks). In this case, several local temperature measurements can be taken via the detection contacts T' connected to the sensors of the device. The measurements can, in this case, be taken independently of the operation of the basic HEMT transistors.

Figure 5:
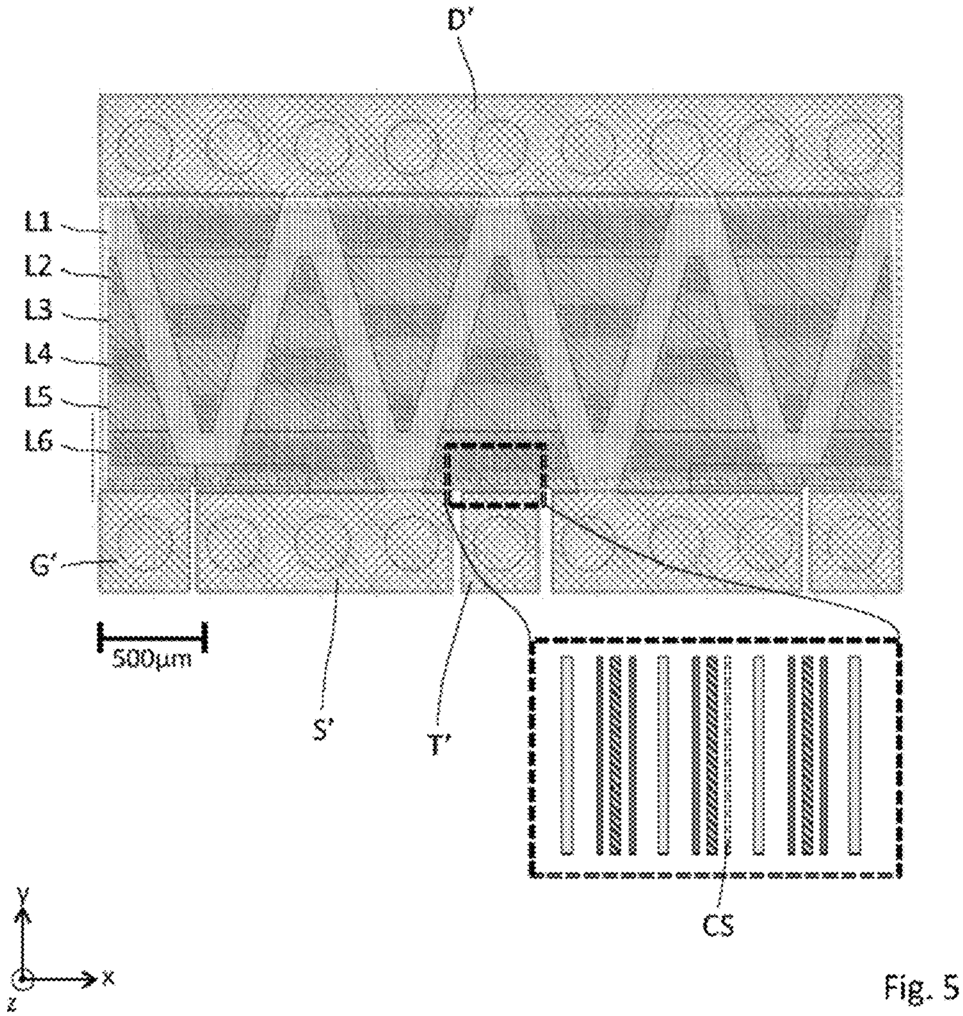
FIG. 5 schematically illustrates, as a top view, a power microelectronic device comprising a HEMT transistor matrix and an integrated temperature sensor, according to an embodiment of the present invention.

FIG. 5 illustrates a design plan of a power microelectronic device comprising six blocks L1, L2, L3, L4, L5, L6 of basic HEMT transistors. A temperature sensor according to the invention has been implanted in the block L6, and connected to an independent contact pad T'.

From the above, it clearly appears that the present invention makes it possible to integrate one or more accurate temperature sensors within a power microelectronic device comprising basic HEMT transistors. The invention is not limited to the embodiments described above.

The invention claimed is:

1. A power microelectronic device comprising:
- a plurality of high electron mobility transistors formed on an active layer and connected in parallel,
- the plurality of high electron mobility transistors including
  - a first transistor comprising a first source finger, a first drain finger and a first gate finger interposed between the first source finger and the first drain finger, and
  - a second transistor comprising a second source finger, a second drain finger and a second gate finger interposed between the second source finger and the second drain finger,
- a source contact common to the first source finger and the second source finger,
- a drain contact common to the first drain finger and the second drain finger, and
- a gate contact common to the first gate finger and the second gate finger, and
- a third gate finger disposed between the first and second transistors, being not connected to the gate contact and forming a Schottky contact with the active layer,
- wherein the third gate finger forms, with a neighboring drain finger from among the first drain finger and second drain finger, at least one Schottky-type diode configured to measure an operating temperature within the power microelectronic device.

2. The device according to claim 1, wherein the third gate finger forming the Schottky contact is connected to a neighboring source finger from the first source finger and the second source finger.

3. The device according to claim 2, wherein the neighboring source finger is connected to the source contact, such that measuring the operating temperature is done through the source contact.

4. The device according to claim 2, comprising at least one detection contact, independent of the source contact, the drain contact, and the gate contact, wherein the neighboring source finger is connected to the at least one detection contact, such that measuring the operating temperature is done through the at least one detection contact.

5. The device according to claim 1, further comprising a barrier layer inserted between the active layer and the first gate finger and the second gate finger, wherein the at least one gate finger forming the Schottky contact passes through at least partially the barrier layer.

6. The device according to claim 1, wherein the third gate finger forming the Schottky contact comprises a plurality of gate fingers forming, with respective neighboring drain fingers from the first drain finger and the second drain finger, a plurality of Schottky-type diodes each configured to measure an operating temperature within the power microelectronic device.

7. The device according to claim 6, further comprising a plurality of independent detection contacts, wherein the the first gate finger, the second gate finger and the third gate finger of the plurality of Schottky diodes are connected to the independent detection contacts, such that the operating temperatures are measured through the detection contacts.

8. The device according to claim 7, wherein one single detection contact of the plurality of independent detection contacts corresponds to one single gate finger of the plurality of Schottky diodes.

9. The device according to claim 6, wherein the plurality of transistors are arranged in matrix form and the plurality of Schottky-type diodes are distributed randomly within the matrix.

10. The device according to claim 6, wherein the plurality of transistors including the first transistor and the second transistor are arranged in rectangular matrix form, the power microelectronic device comprising at least four Schottky-type diodes disposed at four corners of the rectangular matrix.

* * * * *